United States Patent
Li et al.

(10) Patent No.: US 11,122,153 B2
(45) Date of Patent: Sep. 14, 2021

(54) LOW-SPEED SIGNAL PHOTOELECTRIC CONVERSION MODULE FOR DP INTERFACE

(71) Applicant: EverPro Technologies Company Ltd., Wuhan (CN)

(72) Inventors: Yan Li, Beijing (CN); Rui Qin, Beijing (CN); Yufeng Cheng, Beijing (CN); Hui Jiang, Beijing (CN); Lihua Wei, Beijing (CN); Jinkuan Tang, Beijing (CN)

(73) Assignee: EverPro Technologies Company Ltd., Wuhan (CN)

( * ) Notice: Subject to any disclaimer, the term of this patent is extended or adjusted under 35 U.S.C. 154(b) by 105 days.

(21) Appl. No.: 16/678,123

(22) Filed: Nov. 8, 2019

(65) Prior Publication Data

US 2021/0144235 A1    May 13, 2021

(51) Int. Cl.
| | |
|---|---|
| *H04L 29/06* | (2006.01) |
| *H04N 5/765* | (2006.01) |
| *H04N 5/268* | (2006.01) |
| *H01L 31/077* | (2012.01) |
| *H04B 10/40* | (2013.01) |
| *H04L 5/14* | (2006.01) |
| *H04N 7/22* | (2006.01) |
| *H04B 10/25* | (2013.01) |

(52) U.S. Cl.
CPC .......... *H04L 69/22* (2013.01); *H01L 31/077* (2013.01); *H04B 10/2589* (2020.05); *H04B 10/40* (2013.01); *H04L 5/14* (2013.01); *H04N 5/268* (2013.01); *H04N 5/765* (2013.01); *H04N 7/22* (2013.01)

(58) Field of Classification Search
CPC ........ H04L 69/22; H04N 5/765; H04N 5/268; H04N 7/22; H01L 31/077; H04B 10/40; H04B 10/2589
See application file for complete search history.

(56) References Cited

U.S. PATENT DOCUMENTS 10,447,396 B1 * 10/2019 Li .............................. H04L 5/14

* cited by examiner

*Primary Examiner* — Brenda H Pham
(74) *Attorney, Agent, or Firm* — Maier & Maier, PLLC

(57) ABSTRACT

A low-speed signal conversion module for a DP interface is provided, including a protocol parsing module, an encoding module, a decoding module, a sending link, and a receiving link. The protocol parsing module is configured to parse a DP protocol, and send a low-speed signal of the DP interface to the encoding module, or send an output signal of the decoding module to the DP interface. The encoding module is configured to perform encoding in different forms respectively according to different outputs of the protocol parsing module, and transmit the encoded signal to the sending link. In the present invention, different combinations of combined AUX, HPD and null signals are line-encoded respectively according to characteristics of a DP protocol.

14 Claims, 2 Drawing Sheets

LOW-SPEED SIGNAL PHOTOELECTRIC CONVERSION MODULE FOR DP INTERFACE

FIELD

The present invention relates to multimedia interfaces, and in particular, to a low-speed signal conversion module for a DP interface, which can transmit low-speed control signals only through a pair of links, i.e., a sending link and a receiving link, such as a pair of optical fibers while transmitting DP signals with a very low delay by specific encoding, thereby reducing costs and power consumption.

BACKGROUND

In long-distance application scenarios, transmitting multimedia interface signals by a conventional copper wire will cause a large loss, and the manufacturing cost of a high-specification cable will rise sharply with the increase of cable length. Using optical fiber for transmission is a good alternative.

In general, a multimedia interface needs to transmit a plurality of signals simultaneously, and in optical fiber transmission lines, each transmission line requires a separate laser driver and laser receiver. Combining a plurality of signals into one signal and transmitting the combined signal through optical fiber can significantly reduce costs and power consumption and improve the product yield.

For a Display Port (DP) interface, a high-speed signal link, an AUX, and an HPD are comprised. A Global Time Code (GTC) function of the DP interface requires that the time precision of devices at two ends of a DP cable when measuring GTC-related signals on an AUX link reaches 10.25 ns. In the case of long-distance transmission, optical fiber is usually used for transmission. If AUX signals are transmitted by a pair of dedicated optical fibers, the requirement on time precision can be met. However, an additional optical fiber is further required to transmit HPD, resulting in wastes of costs and power consumption. If AUX and HPD are sampled in a common parallel-to-serial conversion method, and the signals are transmitted through a pair of optical fibers after being packaged, encoded, and combined, the wastes of costs and power consumption can be avoided; however, the requirement of the GTC function on time precision can hardly be met due to the delay introduced by parallel-to-serial conversion.

Therefore, how to reduce transmission paths of optical fiber while transmitting DP signals with a very low delay to thus reduce costs and power consumption has become an urgent problem to be solved in the prior art.

SUMMARY

An objective of the present invention is to propose a low-speed signal conversion module for a DP interface.

In order to achieve the objective, the following technical solution is adopted in the present invention.

A low-speed signal conversion module for a DP interface, comprising: a protocol parsing module, an encoding module, a decoding module, a sending link, and a receiving link, wherein the protocol parsing module is configured to parse a DP protocol, and send a low-speed signal of the DP interface to the encoding module, or send an output signal of the decoding module to the DP interface;

the encoding module is configured to perform encoding in different forms respectively according to different outputs of the protocol parsing module, and transmit the encoded signal to the sending link, wherein if the signal is a low-level HPD signal, the signal is encoded as a first periodic signal; if the signal is a high-level HPD signal without AUX signal, the signal is encoded as a second periodic signal; and if the signal is an AUX signal plus high-level HPD signal, the AUX signal is output directly;

the decoding module is configured to decode a received signal according to a respective rule, and send the decoded signal to the protocol parsing module, wherein when a first periodic signal is received, the signal is decoded as a low-level HPD signal; when a second periodic signal is received, the signal is decoded as a high-level HPD signal without AUX signal; and when an AUX signal is received, the signal is decoded as an AUX signal plus high-level HPD signal;

the sending link is configured to perform transmission according to the encoded signal sent by the encoding module; and the receiving link is configured to receive the encoded signal sent by the opposite end and transmit the encoded signal to the decoding module.

Optionally, when parsing a protocol, the protocol parsing module needs to judge whether a signal transmitted at the current moment is an AUX signal plus high-level HPD signal, a low-level HPD signal, or a high-level HPD signal without AUX signal, and if the signal is an AUX signal plus high-level HPD signal, the protocol parsing module needs to further judge the direction of the AUX signal, and send the corresponding AUX and HPD signals to the DP interface or the encoding module.

Optionally, a transmission medium of the sending link and the receiving link is copper cable, wireless transmission medium, or optical fiber.

Optionally, when the transmission medium of the sending link and the receiving link is optical fiber, the sending link further comprises an electro-optic conversion module, and the receiving link further comprises a photo-electric conversion module, wherein the electro-optic conversion module is configured to convert an electrical signal of the encoding module into an optical signal and send the optical signal, through optical fiber, to the other party communicating through the DP interface; and the photo-electric conversion module is configured to receive, through optical fiber, an optical signal transmitted by the other party communicating through the DP interface, convert the optical signal into an electrical signal, and send the electrical signal to the decoding module.

Optionally, the first periodic signal and the second periodic signal have different periods, so that the decoding module can identify different signals and adopt the different signals suitable for high-speed transmission.

Optionally, the first periodic signal is a periodic signal at 10 MHz, and the second periodic signal is a periodic signal at 20 MHz.

Optionally, the AUX signal is converted from a half-duplex signal into a full-duplex signal by the protocol parsing module before the AUX signal is transmitted.

The present invention has the following advantages.

1. In the present invention, AUX and HPD signals are combined and transmitted with a low delay according to characteristics of a DP protocol, so that the requirement of a GTC function on time precision during signal transmission can be met.

2. In the present invention, different combinations of combined AUX, HPD and null signals are line-encoded respectively, so that low-speed control signals of a DP protocol can be transmitted through light.

3. In the present invention, the method of combining and encoding AUX and HPD signals is not limited by the transmission medium. The suitable transmission medium includes, but is not limited to, light, and a wired medium such as copper wire or a wireless medium is also suitable.

Figure 1:
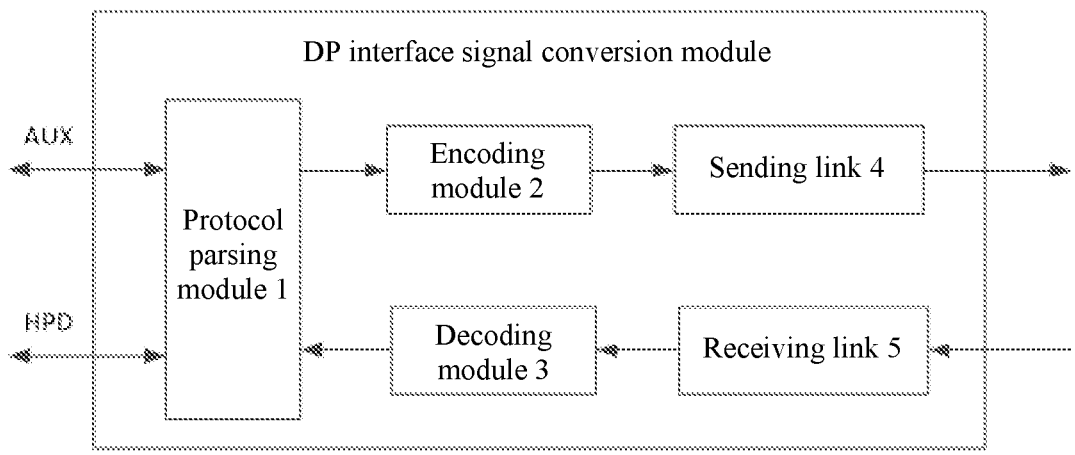
FIG. 1 is a schematic diagram of a low-speed signal conversion module for a DP interface according to a specific embodiment of the present invention.

Technical features denoted by reference numerals in the figures respectively are:
1. protocol parsing module;
2. encoding module;
3. decoding module;
4. sending link;
41. electro-optic conversion module;
5. receiving link;
51. photo-electric conversion module.

DETAILED DESCRIPTION

The present invention is described below in further detail with reference to the accompanying drawings and embodiments. It would be appreciated that specific embodiments described here are merely used to explain the present invention instead of limiting the present invention. In addition, it should also be noted that only some of, rather than, all the structures related to the present invention are illustrated in the accompanying drawings for ease of description.

A DP link includes a main link, an AUX channel, and an HPD signal line. The main link is a one-way, high-bandwidth, low-delay channel for transmitting synchronous data streams such as video and audio. The present invention is mainly aimed at the AUX channel and the HPD signal line of a DP link.

The AUX channel is a half-duplex two-way channel between a DP sending terminal and a DP receiving terminal. Data is transmitted by a pair of differential lines in two possible transmission formats, i.e., a 1-Mbps Manchester-II encoding format and a 675-Mbps ANSI8B/10B encoding-based FAUX format. A DP source device is used as an AUX master device, and a DP sink device is used as an AUX slave device. The source device is responsible for initiating AUX communication. The sink device can initiate an interrupt to the source device through HPD low-level pulses to request AUX communication, for link management and device control.

According to the DP protocol, the HPD is at a high level in normal operation, and low-level pulses can be generated only in two cases. When the HPD low-level pulse has a width between 0.5 ms and 1 ms, it will be regarded as an interrupt request generated by the DP sink device. When the HPD low-level pulse has a width greater than 2 ms, it will be regarded as a hot plug event.

Therefore, three combinations of HPD and AUX signals can be analyzed as follows.

In the first situation, the HPD is at a low level. Since HPD is a one-way signal from the sink device to the source device, when the HPD is at a low level, the sink device of the DP interface usually does not send an AUX signal; even if HPD and AUX signals are sent at the same time, the HPD has a higher priority than the AUX in this case. Therefore, when the HPD is at a low level, only the HPD signal needs to be transmitted in a direction from the sink device to the source device, while the AUX signal does not need to be transmitted. Therefore, only one kind of signals is transmitted in this case, and compression and combination are not necessary.

The second situation and the third situation both correspond to the HPD being at a high level. In this case, there are two conditions for the AUX signal: the AUX signal is transmitted, or there is no AUX signal. At this point, the HPD signal and the AUX signal need to be combined. The HPD is considered as at a high level by default whether the AUX signal is transmitted or not. Therefore, only certain signals are needed to represent transmission of the AUX signal and non-transmission of the AUX signal, and the default high-level HPD signal is omitted, thus realizing combination of signals.

That is, when the HPD is at a high level and there is an AUX signal, the AUX signal is not encoded but is directly photoelectrically converted and transmitted by the sink device. After observing the AUX signal, the source device parses it as an AUX signal plus high-level HPD signal. When the HPD is at a high level and there is no AUX signal, the sink device is represented by a special coding. When observing the specific coding, the source device directly parses the specific coding as no AUX signal plus high-level HPD signal. When the HPD is at a low level, the sink device performs another special encoding on the HPD, and after that, the HPD is photoelectrically converted and transmitted. No AUX signal is transmitted in this case. After observing the HPD with another special encoding, the source device parses it as no AUX signal plus low-level HPD signal. As such, AUX and HPD signals can be combined with a very low delay and then transmitted without affecting the DP protocol, so that low-speed control signals can be transmitted only through a pair of transmission channels, such as a pair of optical fibers while the requirement of the GTC function on time precision during signal transmission is met, thus reducing costs and power consumption.

Referring to FIG. 1, a low-speed signal conversion module for a DP interface according to a specific embodiment of the present invention is illustrated, including a protocol parsing module 1, an encoding module 2 a decoding module 3, a sending link 4, and a receiving link 5.

The protocol parsing module 1 is configured to parse a DP protocol, and send a low-speed signal of a DP interface to the encoding module 2 or send an output signal of the decoding module 3 to the DP interface.

The encoding module 2 is configured to perform encoding in different forms respectively according to different outputs of the protocol parsing module, and transmit the encoded signal to the sending link 4, wherein if the signal is a low-level HPD signal, the signal is encoded as a first periodic signal; if the signal is a high-level HPD signal without AUX signal, the signal is encoded as a second periodic signal; and if the signal is an AUX signal plus high-level HPD signal, the AUX signal is directly output. The first periodic signal and the second periodic signal have different periods, so that the decoding module can identify different signals and adopt the different signals suitable for high-speed transmission.

The decoding module 3 is configured to decode a received signal according to a respective rule, and send the decoded signal to the protocol parsing module, wherein when a first periodic signal is received, the signal is decoded as a low-level HPD signal, when a second periodic signal is received, the signal is decoded as a high-level HPD signal without AUX signal, and when an AUX signal is received, the signal is decoded as an AUX signal plus high-level HPD signal.

The sending link 4 is configured to perform transmission according to the encoded signal sent by the encoding module 2.

The receiving link 5 is configured to receive the encoded signal sent by the opposite end and transmit the encoded signal to the decoding module 3.

Therefore, as described above in the present invention, a specific encoding method is adopted for several different forms of AUX and HPD signals to compress transmission channels, so that only one signal for receiving and one signal for transmission are needed at the same moment, which not only reduces transmission channels but also reduces costs and power consumption.

In a specific embodiment, the first periodic signal is a periodic signal at 10 MHz, and the second periodic signal is a periodic signal at 20 MHz. However, this is only an example. It is only necessary to make the periods of the first periodic signal and the second periodic signal different so that the decoding module can identify different signals and adopt the different signals suitable for high-speed transmission.

Further, the AUX signal is a two-way half-duplex signal. Referring to FIG. 1, the protocol parsing module 1 is connected to an AUX signal and an HPD signal on one side and connected to the encoding and decoding modules on the other side and has AUX signals transmitted from different directions. Therefore, when parsing a protocol, the protocol parsing module 1 needs to judge whether a signal transmitted at the current moment is an AUX signal plus high-level HPD signal, a low-level HPD signal, or a high-level HPD signal without AUX signal, and if the signal is an AUX signal plus high-level HPD signal, the protocol parsing module needs to further judge the direction of the AUX signal, and send the corresponding AUX and HPD signals to the DP interface or the encoding module 2.

In the present invention, the sending link 4 and the receiving link 5 are not specially limited, which can be copper cable, wireless transmission medium, or optical fiber.

When long-distance transmission is adopted, optical fiber is preferred for transmission.

Figure 2:
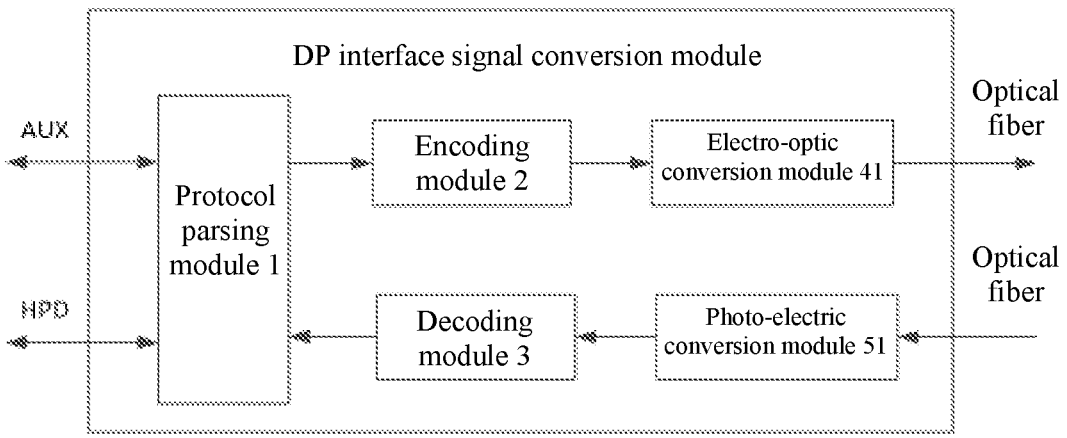
FIG. 2 is a schematic diagram of a low-speed signal conversion module for a DP interface according to another specific embodiment of the present invention.

In this case, referring to FIG. 2, the sending link 4 further includes an electro-optic conversion module 41, and the receiving link 5 further includes a photo-electric conversion module 51.

The electro-optic conversion module 41 is configured to convert an electrical signal of the encoding module 2 into an optical signal and send the optical signal, through optical fiber, to the other party communicating through the DP interface.

The photo-electric conversion module 51 is configured to receive, through optical fiber, an optical signal transmitted by the other party communicating through the DP interface, convert the optical signal into an electrical signal, and send the electrical signal to the decoding module 3.

In addition, in order to adapt to high-speed signal transmission, the AUX signal can be converted from a half-duplex signal into a full-duplex signal by the protocol parsing module 1 before the AUX signal is transmitted, and then used for transmission.

Figure 3:
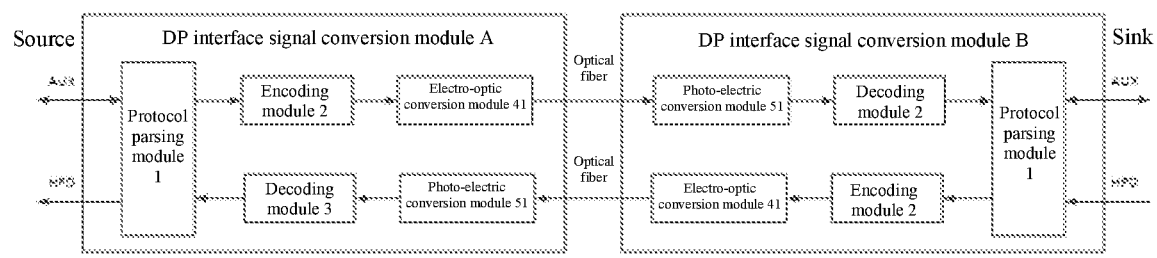
FIG. 3 is a schematic diagram of two-way communication of a low-speed signal conversion module according to a specific embodiment of the present invention.

Referring to FIG. 3, a schematic diagram of two-way communication of a low-speed signal conversion module is illustrated.

FIG. 3 illustrates an example of transmission from a source to a sink. A source device sends a DP low-speed control signal transferred to a sink device to a DP interface signal photo-electric conversion module A. The protocol parsing module judges according to a DP protocol whether a signal transmitted at the current moment is an AUX signal plus high-level HPD signal or a high-level HPD signal without AUX signal. If the signal is an AUX signal plus high-level HPD signal, the direction of the AUX signal needs to be further judged. The signal is converted by the protocol parsing module into a full-duplex signal and sent to the encoding module.

The encoding module in the DP interface signal photo-electric conversion module A performs encoding in different forms respectively according to different outputs of the protocol parsing module. If the signal is an AUX signal plus high-level HPD signal, the AUX signal is directly output to the electro-optic conversion module. If the signal is a low-level HPD signal, the signal is encoded as a periodic signal at 10 MHz. If the signal is a high-level HPD signal without AUX signal, the signal is encoded as a periodic signal at 20 MHz and sent to the electro-optic conversion module.

The electro-optic conversion module in the DP interface signal photo-electric conversion module A converts a high-speed electrical signal suitable for optical communication into an optical signal, and sends the optical signal through optical fiber to a photo-electric conversion module in a DP interface signal photo-electric conversion module B.

The photo-electric conversion module in the DP interface signal photo-electric conversion module B converts the received optical signal into an encoded high-speed electrical signal and sends the encoded high-speed electrical signal to a decoding module.

The decoding module in the DP interface signal photo-electric conversion module B decodes the high-speed electrical signal as a low-speed signal and sends the low-speed signal to a protocol parsing module.

The protocol parsing module in the DP interface signal photo-electric conversion module B judges according to the signal obtained by decoding whether a signal transmitted at the current moment is an AUX signal plus high-level HPD signal or a high-level HPD signal without AUX signal, and after further judging the direction of the AUX signal, sends the AUX and HPD signals to the sink device through the DP interface.

After processing information sent by the source device, the sink device sends a DP low-speed control signal, which is returned to the source device, to the DP interface signal photo-electric conversion module B. The protocol parsing module judges according to the DP protocol whether a signal transmitted at the current moment is an AUX signal plus high-level HPD signal, a low-level HPD signal, or a high-level HPD signal without AUX signal. If the signal is an AUX signal plus high-level HPD signal, the direction of the AUX signal needs to be further judged. The signal is converted by the protocol parsing module into a full-duplex signal and sent to the encoding module.

The encoding module in the DP interface signal photo-electric conversion module B performs encoding in different forms respectively according to different outputs of the protocol parsing module. If the signal is an AUX signal plus high-level HPD signal, the AUX signal is directly output to the electro-optic conversion module. If the signal is a low-level HPD signal, the signal is encoded as a periodic signal at 10 MHz. If the signal is a high-level HPD signal without AUX signal, the signal is encoded as a periodic signal at 20 MHz and sent to the electro-optic conversion module.

The electro-optic conversion module in the DP interface signal photo-electric conversion module B converts a high-speed electrical signal suitable for optical communication into an optical signal, and sends the optical signal through optical fiber to the photo-electric conversion module in the DP interface signal photo-electric conversion module A.

The photo-electric conversion module in the DP interface signal photo-electric conversion module A converts the received optical signal into an encoded high-speed electrical signal and sends the encoded high-speed electrical signal to the decoding module.

The decoding module in the DP interface signal photo-electric conversion module A decodes the high-speed electrical signal as a low-speed signal and sends the low-speed signal to the protocol parsing module.

The protocol parsing module in the DP interface signal photo-electric conversion module A judges according to the signal obtained by decoding whether a signal transmitted at the current moment is an AUX signal plus high-level HPD signal, a low-level HPD signal, or a high-level HPD signal without AUX signal, further judges the direction of the AUX signal, and sends the AUX and HPD signals to the source device through the DP interface.

In this embodiment, the DP interface signal photo-electric conversion module A and the DP interface signal photo-electric conversion module B have the same modules and functions, only except that they have different sources or sinks, and low-level HPD signals can only be transmitted from the sink to the source.

The above source and sink circuits connected through the DP interface signal photo-electric conversion device indicate that the technical solution of the invention is achievable, and the principles of the technical solution are suitable not only to the above circuits, but also to the implementation by firmware or software.

In conclusion, the present invention has the following advantages.

1. In the present invention, AUX and HPD signals are combined and transmitted with a low delay according to characteristics of a DP protocol, so that the requirement of the GTC function on time precision during signal transmission can be met.

2. In the present invention, different combinations of combined AUX, HPD and null signals are line-encoded respectively, so that low-speed control signals of a DP protocol can be transmitted through light.

3. In the present invention, the method of combining and encoding AUX and HPD signals is not limited by the transmission medium. The suitable transmission medium includes, but is not limited to, light, and a wired medium such as copper wire or a wireless medium is also suitable.

Obviously, it should be appreciated by those skilled in the art that the above units or steps of the present invention can be implemented using a general-purpose computing device, and they can be concentrated on a single computing device. Optionally, they can be implemented using program code executable by a computer device, so that they can be stored in a storage device and executed by a computing device, or they can be made into respective integrated circuit modules, or a plurality of modules or steps of them can be made into a single integrated circuit module. As such, the present invention is not limited to any specific hardware or software structure.

The above content is a further detailed description of the present invention with reference to specific preferred implementations. It cannot be concluded that the specific implementations of the present invention are merely limited to this. Those of ordinary skill in the art can also make several simple deductions or replacements without departing from the idea of the present invention. The deductions or replacements should be regarded as falling within the protection scope of the present invention defined by the submitted claims.

The invention claimed is:

1. A method of low-speed signal conversion for a DP (Display Port) interface, wherein the method is performed by a low-speed signal conversion module comprising a protocol parsing module, an encoding module, a decoding module, a sending link, and a receiving link, the method comprising:
    parsing, by the protocol parsing module, a DP (Display Port) protocol, and sending a low-speed signal of the DP interface to the encoding module, or sending an output signal of the decoding module to the DP interface;
    encoding, by the encoding module, in different forms respectively according to different outputs of the protocol parsing module, and transmitting the encoded signal to the sending link, wherein if the signal is a low-level HPD signal, the signal is encoded as a first periodic signal; if the signal is a high-level HPD signal without AUX signal, the signal is encoded as a second periodic signal; and if the signal is an AUX signal plus high-level HPD signal, the AUX signal is output directly;
    decoding, by the decoding module, a received signal according to a respective rule, and sending the decoded signal to the protocol parsing module, wherein when a first periodic signal is received, the signal is decoded as a low-level HPD signal; when a second periodic signal is received, the signal is decoded as a high-level HPD signal without AUX signal; and when an AUX signal is received, the signal is decoded as an AUX signal plus high-level HPD signal;
    transmitting, by the sending link, according to the encoded signal sent by the encoding module; and
    receiving, by the receiving link, the encoded signal sent by the opposite end and transmit the encoded signal to the decoding module.

2. The method of claim 1, wherein when parsing a protocol, the protocol parsing module needs to judge whether a signal transmitted at the current moment is an AUX signal plus high-level HPD signal, a low-level HPD signal, or a high-level HPD signal without AUX signal, and if the signal is an AUX signal plus high-level HPD signal, the protocol parsing module needs to further judge the direction of the AUX signal and send the corresponding AUX and HPD signals to the DP interface or the encoding module.

3. The method of claim 1, wherein a transmission medium of the sending link and the receiving link is copper cable, wireless transmission medium, or optical fiber.

4. The method of claim 3, wherein when the transmission medium of the sending link and the receiving link is optical fiber, the sending link further comprises an electro-optic conversion module, and the receiving link further comprises a photo-electric conversion module, wherein the method further comprises:

converting, by the electro-optic conversion module, an electrical signal of the encoding module into an optical signal and send the optical signal, through optical fiber, to the other party communicating through the DP interface; and receiving, by the photo-electric conversion module, through optical fiber, an optical signal transmitted by the other party communicating through the DP interface, converting the optical signal into an electrical signal, and sending the electrical signal to the decoding module.

5. The method of claim 1, wherein the first periodic signal and the second periodic signal have different periods, so that the decoding module can identify different signals and adopt the different signals suitable for high-speed transmission.

6. The method of claim 5, wherein the first periodic signal is a periodic signal at 10 MHz, and the second periodic signal is a periodic signal at 20 MHz.

7. The method of claim 1, wherein the AUX signal is converted from a half-duplex signal into a full-duplex signal by the protocol parsing module before the AUX signal is transmitted.

8. A non-transitory computer-readable media containing instructions which when executed on a processor of a low-speed signal conversion system, perform a method of low-speed signal conversion for a DP (Display Port) interface, wherein the low-speed signal conversion system comprises a protocol parsing module, an encoding module, a decoding module, a sending link, and a receiving link, the method comprising:

parsing, by the protocol parsing module, a DP (Display Port) protocol, and sending a low-speed signal of the DP interface to the encoding module, or sending an output signal of the decoding module to the DP interface;

encoding, by the encoding module, in different forms respectively according to different outputs of the protocol parsing module, and transmitting the encoded signal to the sending link, wherein if the signal is a low-level HPD signal, the signal is encoded as a first periodic signal; if the signal is a high-level HPD signal without AUX signal, the signal is encoded as a second periodic signal; and if the signal is an AUX signal plus high-level HPD signal, the AUX signal is output directly;

decoding, by the decoding module, a received signal according to a respective rule, and sending the decoded signal to the protocol parsing module, wherein when a first periodic signal is received, the signal is decoded as a low-level HPD signal; when a second periodic signal is received, the signal is decoded as a high-level HPD signal without AUX signal; and when an AUX signal is received, the signal is decoded as an AUX signal plus high-level HPD signal;

transmitting, by the sending link, according to the encoded signal sent by the encoding module; and receiving, by the receiving link, the encoded signal sent by the opposite end and transmit the encoded signal to the decoding module.

9. The non-transitory computer-readable media of claim 8, wherein when parsing a protocol, the protocol parsing module needs to judge whether a signal transmitted at the current moment is an AUX signal plus high-level HPD signal, a low-level HPD signal, or a high-level HPD signal without AUX signal, and if the signal is an AUX signal plus high-level HPD signal, the protocol parsing module needs to further judge the direction of the AUX signal and send the corresponding AUX and HPD signals to the DP interface or the encoding module.

10. The non-transitory computer-readable media of claim 8, wherein a transmission medium of the sending link and the receiving link is copper cable, wireless transmission medium, or optical fiber.

11. The non-transitory computer-readable media of claim 10, wherein when the transmission medium of the sending link and the receiving link is optical fiber, the sending link further comprises an electro-optic conversion module, and the receiving link further comprises a photo-electric conversion module, wherein the method further comprises:

converting, by the electro-optic conversion module, an electrical signal of the encoding module into an optical signal and send the optical signal, through optical fiber, to the other party communicating through the DP interface; and receiving, by the photo-electric conversion module, through optical fiber, an optical signal transmitted by the other party communicating through the DP interface, converting the optical signal into an electrical signal, and sending the electrical signal to the decoding module.

12. The non-transitory computer-readable media of claim 8, wherein the first periodic signal and the second periodic signal have different periods, so that the decoding module can identify different signals and adopt the different signals suitable for high-speed transmission.

13. The non-transitory computer-readable media of claim 12, wherein the first periodic signal is a periodic signal at 10 MHz, and the second periodic signal is a periodic signal at 20 MHz.

14. The non-transitory computer-readable media of claim 8, wherein the AUX signal is converted from a half-duplex signal into a full-duplex signal by the protocol parsing module before the AUX signal is transmitted.

* * * * *